(12) United States Patent
Glass, III et al.

(10) Patent No.: US 11,887,753 B1
(45) Date of Patent: Jan. 30, 2024

(54) SYSTEMS AND METHODS FOR ASSESSING CABLE INSULATION

(71) Applicant: Battelle Memorial Institute, Richland, WA (US)

(72) Inventors: Samuel W. Glass, III, Richland, WA (US); Nicola Bowler, Ames, IA (US)

(73) Assignee: Battelle Memorial Institute, Richland, WA (US)

( * ) Notice: Subject to any disclaimer, the term of this patent is extended or adjusted under 35 U.S.C. 154(b) by 732 days.

(21) Appl. No.: 16/697,760

(22) Filed: Nov. 27, 2019

Related U.S. Application Data

(60) Provisional application No. 62/773,041, filed on Nov. 29, 2018.

(51) Int. Cl.
| | |
|---|---|
| *H01B 13/06* | (2006.01) |
| *G02B 6/44* | (2006.01) |
| *G01N 27/22* | (2006.01) |
| *G01N 27/24* | (2006.01) |
| *G01R 31/08* | (2020.01) |
| *G01R 31/12* | (2020.01) |

(52) U.S. Cl.
CPC ............. *H01B 13/06* (2013.01); *G01N 27/22* (2013.01); *G01N 27/24* (2013.01); *G02B 6/4429* (2013.01); *G01N 27/221* (2013.01); *G01R 31/08* (2013.01); *G01R 31/1227* (2013.01)

(58) Field of Classification Search
CPC ....... G01N 27/221; G01N 27/22; G01N 27/24
See application file for complete search history.

(56) References Cited

U.S. PATENT DOCUMENTS

2015/0137831 A1* 5/2015 Pluta ................... A61B 5/0536
324/647

OTHER PUBLICATIONS

Sheldon, Robert, Electrical and capacitive methods for detecting degradation in wire insulation, 2012, Iowa State University (Year: 2012).*
Aggarwal, "Condition Monitoring Program for Electric Cables Used in Nuclear Power Plants", U.S. Nuclear Regulatory Commission Draft Regulatory Guide DG-1240, Jun. 2010, United States, pp. 1-13.

(Continued)

*Primary Examiner* — Son T Le
*Assistant Examiner* — Matthew W. Baca
(74) *Attorney, Agent, or Firm* — Wells St. John P.S.

(57) ABSTRACT

Methods for assessing cable insulation are provided that can include engaging a first tine gap interdigital capacitor assembly with the exterior of the cable jacket to determine a first capacitance and dissipation factor value of the insulation using the first tine gap interdigital capacitor assembly; engaging a second tine gap interdigital capacitor assembly with the exterior of the cable jacket to determine a second capacitance and dissipation factor value of the insulation using the second tine gap interdigital capacitor assembly. Systems for assessing cable insulation are also provided. The systems can include a cable jacket encompassing cable insulation and conductive material; at least two tine gap interdigital capacitor assemblies engaged with the cable jacket; and processing circuitry operatively engaged with the capacitor assemblies.

14 Claims, 6 Drawing Sheets
(4 of 6 Drawing Sheet(s) Filed in Color)

(56) References Cited

OTHER PUBLICATIONS

Aggarwal, "Condition-Monitoring Techniques for Electric Cables Used in Nuclear Power Plants", U.S. Nuclear Regulatory Commission Regulatory Guide 1.218, Apr. 2012, United States, pp. 1-16.
Bernstein et al., "Expanded Materials Degradation Assessment (EMDA) vol. 5: Aging of Cables and Cable Systems", U.S. Nuclear Regulatory Commission Report No. NUREG/CR-7153, vol. 5; ORNL/TM-2013/532, Oct. 2013, United States, 107 pages.
Bowler et al., "Aging Mechanisms and Monitoring of Cable Polymers", International Journal of Prognostics and Health Management 6, 2015, United States, pp. 1-12.
Bustard et al., "Low-Voltage Environmentally-Qualified Cable License Renewal Industry Report; Revision 1", Electric Power Research Institute Repor No. TR-103841, 1994, United States, 313 pages.
Chen et al., "Analysis of a Capacitive Sensor for the Evaluation of Circular Cylinders with a Conductive Core", Measurement Science and Technology 23(4), 2012, United Kingdom, pp. 1-10.
Chen et al., "Analysis of a Concentric Coplanar Capacitive Sensor Using a Spectral Domain Approach", AIP Annual Review of Progress in Quantitative Nondestructive Evaluation vol. 30, Jul. 18-23, 2010, United States, pp. 1647-1654.
Chen et al., "Analysis of Arc-Electrode Capacitive Sensors for Characterization of Dielectric Cylindrical Rods", IEEE Transactions on Instrumentation and Measurement vol. 61, No. 1, Jan. 2012, United States, pp. 233-240.
Chen et al., "Analysis of Concentric Coplanar Capacitor for Quantitative Dielectrometry", Electromagnetic Nondestructive Evaluation (XIII), 2010, The Netherlands, pp. 61-68.
Chen et al., "Design of Interdigital Spiral and Concentric Capacitive Sensors for Materials Evaluation", AIP 39th Annual Review of Progress in Quantitative Nondestructive Evaluation, Jul. 15-20, 2013, United States, pp. 1593-1600.
Fifield et al., "Assessment of Cable Aging Equipment, Status of Acquired Materials, and Experimental Matrix at the Pacific Northwest National Laboratory", Pacific Northwest National Laboratory Report No. PNNL-24198, Mar. 2015, United States, 11 pages.
Glass et al., "Evaluation of Localized Cable Test Methods for Nuclear Power Plant Cable Aging Management Programs", Pacific Northwest National Laboratory Report No. PNNL-25432, May 2016, United States, 50 pages.
Glass et al., "Interdigital Capacitance Local Non-Destructive Examination of Nuclear Power Plant Cable for Aging Management Programs", Pacific Northwest National Laboratory Report No. PNNL-27546, May 2018, United States, 58 pages.
Glass et al., "Interdigital Capacitance Local Non-Destructive Examination of Nuclear Power Plant Cable for Aging Management Programs—Interim Report", Pacific Northwest National Laboratory Report No. PNNL-26807, Sep. 2017, United States, 45 pages.
Glass et al., "Physics-Based Modeling of Cable Insulation Conditions for Frequency Domain Reflectometry (FDR)", Pacific Northwest National Laboratory Report No. PNNL-26493, May 2017, United States, 76 pages.
Glass et al., "State-of-the-Art Assessment of NDE Techniques for Aging Cable Management in Nuclear Power Plants FY2015", Pacific Northwest National Laboratory Report No. PNNL-24649, Sep. 2015, United States, 40 pages.
Huang et al., "Optimization of the Coplanar Interdigital Capacitive Sensor", AIP 43rd Annual Review of Progress in Quantitative Nondestructive Evaluation vol. 36, 2017, United States, 9 pages.
International Atomic Energy Agency, "Assessing and Managing Cable Ageing in Nuclear Power Plants", IAEA Nuclear Energy Series No. NP-T-3.6, 2012, Vienna, 111 pages.
Landau et al., "Mechanics", Third Edition, vol. 1 of Course of Theoretical Physics, 1960, United Kingdom, 186 pages.
Li et al., "Design Principles for Multichannel Fringing Electric Field Sensors", IEEE Sensors Journal vol. 6, No. 2, Apr. 2006, United States, pp. 434-440.

Lindsay et al., "Ageing Management of Cable in Nuclear Generating Stations", RCM Technologies, Canadian Nuclear Safety Commission Report No. RSP-0284, Sep. 2012, Canada, 131 pages.
Matiss, "Multi-Element Capacitive Sensor for Non-Destructive Measurement of the Dielectric Permittivity and Thickness of Dielectric Plates and Shells", NDT&E International 66, 2014, The Netherlands, pp. 99-105.
Menczel et al., "Thermal Analysis of Polymers: Fundamentals and Applications", Wiley & Sons, 2009, United States, 689 pages.
Olmi et al., "Diagnostics and Monitoring of Frescoes Using Evanescent-Field Dielectrometry", Measurement Science and Technology 17(8), 2006, United Kingdom, pp. 2281-2288.
Orrit-Prat et al., "Dielectric and Mechanical Characterization of PVC Composites with Ground Tire Rubber", Journal of Composite Materials 45(11), 2010, United States, pp. 1233-1243.
Ramuhalli et al., "Assessment of Additional Key Indicators of Aging Cables in Nuclear Power Plants—Interim Status for FY2015", Pacific Northwest National Laboratory Report No. PNNL-24309, United States, May 2015, 57 pages.
Shay et al., "Cylindrical Geometry Electroquasistatic Dielectrometry Sensors", IEEE Transactions on Dielectrics and Electrical Insulation vol. 12, No. 1, Feb. 2005, United States, pp. 41-49.
Sheldon et al., "An Interdigital Capacitive Sensor for Quantitative Characterization of Wire Insulation", AIP 39th Annual Review of Progress in Quantitative Nondestructive Evaluation, Jul. 15-20, 2013, United States, pp. 1578-1585.
Simmons et al., "Determining Remaining Useful Life of Aging Cables in Nuclear Power Plants—Interim Status for FY2014", Pacific Northwest National Laboratory Report No. PNNL-23624, Sep. 2014, United States, 73 pages.
Simmons et al., "Light Water Reactor Sustainability (LWRS) Program—Non-Destructive Evaluation (NDE) R&D Roadmap for Determining Remaining Useful Life of Aging Cables in Nuclear Power Plants", Pacific Northwest National Laboratory Report No. PNNL-21731, Sep. 2012, United States, 41 pages.
The Okonite Company, "Okoguard® Aerial Jumper Cable", Product Data Section 6, Sheet 4, available online at http://okonite.com/Product_Catalog/section6/sheet4.html, Sep. 7, 2017, 2 pages.
Toman, "Initial Acceptance Criteria Concepts and Data for Assessing Longevity of Low-Voltage Cable Insulations and Jackets", Electric Power Research Institute Final Report TR-1008211, Mar. 2005, United States, 115 pages.
Toman, "Plant Engineering: Electrical Cable Test Applicability Matrix for Nuclear Power Plants", Electric Power Research Institute Final Report 1022969, Dec. 2011, United States, 119 pages.
Verardi, "Aging of Nuclear Power Plant Cables: In Search of Non-Destructive Diagnostic Quantities", University of Bologna, 2013, Italy, 128 pages.
"Proceedings of the 18th International Conference on Environmental Degration of Materials in Nuclear Power Systems—Water Reactors", vol. 2, The Minerals, Metals & Materials Series, 2018, Switzerland, 1308 pages.
Arvia et al., "A Capacitive Test Method for Cable Insulation Degradation Assessment", IEEE Conference on Electrical Insulation and Dielectric Phenomena (CEIDP), Oct. 19-22, 2014, United States, pp. 514-517.
Bowler et al., "A New Test Method for Cable Insulation Degradation Assessment: Capacitive Sensing", ANS Topical Meeting on Nuclear Power Plant Instrumentation, Control and Human-Machine Interface Technologies (NPIC-HMIT), Feb. 23-26, 2015, United States, 8 pages.
Chen et al., "A Rotationally Invariant Capacitive Probe for Materials Evaluation", Materials Evaluation 70, 2012, United States, pp. 161-172.
Chen et al., "Analysis of Concentric Coplanar Capacitive Sensor for Nondestructive Evaluation of Multi-Layered Dielectric Structures", IEEE Transactions on Dielectrics and Electrical Insulation 17(4), 2010, United States, pp. 1307-1318.
Fifield et al., "Non-Destructive Evaluation of Polyolefin Thermal Aging Using Infrared Spectroscopy", SPIE 10169, Nondestructive Characterization and Monitoring of Advanced Materials, Aerospace, and Civil Infrastructure, Mar. 25-29, 2017, United States, March 25-29, 9 pages.

(56) References Cited

OTHER PUBLICATIONS

Imperatore, "Dielectric Spectroscopy as a Condition Monitoring Diagnostic Technique for Thermally Aged Pvc/Epr Nuclear Power Plant Cables", Electrical Engineering, 2017, Italy, 143 pages.
Liu et al., "Application of Interdigital Capacitive Sensors for Detecting Power Cable Insulation Damage", IEEE International Conference on Mechatronics and Automation (ICMA), 2015, United States, pp. 1795-1799.
Mantey, "Evaluation and Insights from Nuclear Power Plant Tan Delta Testing and Data Analysis—Update", IEEE Proceedings of the Power and Energy Society Insulated Conductors Committee, 2015, United States, 29 pages.
Mantey, "Plant Engineering: Evaluation and Insights from Nuclear Power Plant Tan Delta Testing and Data Analysis—Update", Electric Power Research Institute Report No. TR-3002005321, Sep. 2015, United States, 72 pages.
Nassr et al., "Coplanar Capacitance Sensors for Detecting Water Intrusion in Composite Structures", Measurement Science and Technology 19(7), 2008, United Kingdom, 8 pages.
Nassr et al., "Non-Destructive Evaluation of Laminated Composite Plates Using Dielectrometry Sensors", Smart Materials and Structures 18(5), 2009, United Kingdom, 9 pages.
Shao et al., "Capacitive Nondestructive Evaluation of Aged Cross-Linked Polyethylene (XLPE) Cable Insulation Material", 18th International Conference on Environmental Degradation of Materials in Nuclear Power Systems—Water Reactors, Aug. 13-17, 2017, United States, pp. 87-97.
Sheldon et al., "An Interdigital Capacitive Sensor for Nondestructive Evaluation of Wire Insulation", IEEE Sensors Journal 14(4), 2014, United States, pp. 961-970.
Sheldon et al., "Dielectrometry Sensors for Nondestructive Testing of Glass-Fiber Polymer-Matrix Composites", Materials Evaluation 72(11), 2014, United States, pp. 1421-1428.
Shull et al., "Characterization of Capacitive Array for NDE Applications", Research in Nondestructive Evaluation 2(1), 1990, United Kingdom, pp. 11-27.
Sun et al., "A Capacitive Sensor for Nuclear Power Plant Cable Monitoring", Materials Evaluation 74(10), 2016, United States, pp. 1467-1471.

\* cited by examiner

FIG. 12

SYSTEMS AND METHODS FOR ASSESSING CABLE INSULATION

CROSS REFERENCE TO RELATED APPLICATION

This application claims priority to and the benefit of U.S. Provisional Patent Application Ser. No. 62/773,041 filed Nov. 29, 2018, entitled "Methods and Systems for Assessing Cable Insulation", the entirety of which is incorporated by reference herein.

STATEMENT AS TO RIGHTS TO INVENTIONS MADE UNDER FEDERALLY-SPONSORED RESEARCH AND DEVELOPMENT

This invention was made with Government support under Contract DE-AC0576RL01830 awarded by the U.S. Department of Energy. The Government has certain rights in the invention.

TECHNICAL FIELD

The present disclosure relates to conductive cable, and in particular embodiments, systems and methods for assessing cable insulation within conductive cable.

BACKGROUND

Often cable insulation is covered by a polymer jacket. The dielectric properties of many cable jacket and insulation polymers are known to change due to thermal and/or radiation exposure-related damage. These dielectric properties frequently track with other measures of cable aging, such as tensile elongation-at-break and indenter modulus that have been broadly established as cable insulation polymer assessment methods. The external jacket of a cable is likely to have a different permittivity from the underlying insulation, and frequently the jacket material exhibits more severe damage and corresponding change in permittivity than the insulation material due to environmental exposure. Because the jacket serves primarily to guard the cable during installation, as long as the underlying insulation condition is acceptable, the jacket condition is relatively unimportant in service. Accordingly, a need exists for systems and methods to assess cable insulation without removing or damaging the jacket.

SUMMARY

Methods for assessing cable insulation are provided. The methods can include engaging a first tine gap interdigital capacitor assembly with a first portion of the exterior of the cable jacket; and determining a first capacitance and dissipation factor; determining a first capacitance and dissipation factor of the insulation using the first tine gap interdigital capacitor assembly; engaging a second tine gap interdigital capacitor assembly with a second portion of the exterior of the cable jacket; and determining a second capacitance and dissipation factor value of the insulation using the second tine gap interdigital capacitor assembly. In particular embodiments, the first and second tine gap interdigital capacitor assemblies can have different gap widths hereafter referred to as g values. The methods can further include using the first and second capacitance and dissipation factor to determine the cable insulation condition.

In accordance with example implementations, the methods can be performed nondestructively. The methods can leverage permittivity related to interdigital capacitance and dissipation factor to correlate with cable insulation condition, for example age-related damage. The methods can determine the insulation properties by measuring through an overlaying polymer jacket that precludes direct contact with the insulation. Methods can include engaging a first tine gap, such as a narrow gap interdigital capacitor sensor assembly with a first portion of the exterior of the cable jacket and measuring capacitance and dissipation factor. The methods can include engaging a second tine gap, such as a wide gap interdigital capacitor assembly with a second portion or with the same portion of the exterior of the cable jacket and measuring the capacitance and dissipation factor. The methods can also include, then using the two capacitance measurements or dissipation factor measurements taken on the jacket to estimate the first tine gap (narrow gap) capacitance and associated permittivity; or the two dissipation factor measurements to determine the first tine gap (narrow gap) dissipation factor of the underlying insulation as though the first tine gap sensor were to be placed directly on the underlying insulation. In particular embodiments, the first and second tine gap interdigital capacitor sensor assemblies must have different tine gap g values with correspondingly different depths of field that influence measurements. The methods can further include using the estimated permittivity, capacitance, or dissipation factor to determine the cable insulation age-related damage.

Systems for assessing cable insulation condition are also provided. The systems can include a cable jacket encompassing cable insulation and conductive material; at least two tine gap interdigital capacitor assemblies engaged with the cable jacket; and processing circuitry operatively engaged with the capacitor assemblies. The systems can use interdigital capacitance sensors.

DRAWINGS

The patent or application file contains at least one drawing executed in color. Copies of this patent or patent application publication with color drawing(s) will be provided by the Office upon request and payment of the necessary fee.

Embodiments of the disclosure are described below with reference to the following accompanying drawings.

DESCRIPTION

This disclosure is submitted in furtherance of the constitutional purposes of the U.S. Patent Laws "to promote the progress of science and useful arts" (Article 1, Section 8).

Disclosed are embodiments of systems and methods that can be utilized to non-destructively measure cable insulation conditions through a cable jacket in a nondestructive minimally invasive manner.

In some embodiments, the method can include measuring capacitance and dissipation factor with a dual tine gap interdigital capacitor (IDC) device that can be related to the material permittivity value of insulation in a cable without contacting the insulation; and associating the permittivity value with a condition of the cable insulation. In certain embodiments, the measuring can occur through a jacket that surrounds and covers the insulation thereby eliminating opportunity to directly contact the insulation. In particular embodiments, the inferred underlying insulation capacitance, permittivity, and dissipation factor is based on a multi-regression analysis of a set of representative cable samples or models with varying permittivity.

Embodiments described herein can include an IDC and fixture to measure the effect of cable polymer dielectric property change on the sensor response. The IDC can include two fork-like electrodes facing each other with the fork tines interspersed and separated by a small gap. The electrodes can be printed on one side of a flexible substrate that can be conformed to the surface of a cylindrical cable. Although example embodiments have tines parallel to the cable axis, they could be wrapped around the cable such that their projection is at 90° to the cable axis, or at any arbitrary orientation to it. It can be important to have electrodes in close proximity to the polymer insulation or jacket with little or no gap. The electrodes can be connected to a broad-frequency spectral impedance meter that senses the capacitance between the electrode tines. This capacitance can vary as a function of the permittivity of any material in close proximity to the electrodes. By finite element modeling (FEM) and experimentation, the effect of tine spacing and other design parameters associated with the IDC on the voltage (potential) distribution and electric field depth of penetration can be determined.

The IDC measurement (capacitance and dissipation factor) of an unshielded ethylene-propylene rubber (EPR)-insulated cable can track with the degree of aging. For jacketed cable systems, the IDC response is dominated by the jacket but, by analyzing measurements from IDC sensors with different depths-of-field penetration into the cable under test, the influence of the cable jacket material degradation can be separated from an assessment of the cable insulation thereby providing for assessment of the insulation beneath/through the jacket.

No other non-destructive examination (NDE) and minimally invasive technique is known that can measure or infer the permittivity or condition of underlying insulation through a polymer jacket. Embodiments described herein do not assume that the condition of the polymer jacket is unchanging. The present disclosure determined that the jacket permittivity is likely to change more than the insulation. The dual tine gap IDC can be used to assess changing insulation permittivity through a changing jacket permittivity. In some embodiments, assessment is based at least in part on a multi-regression analysis of representative samples that were aged and that had part of the jacket cut off from the aged cable segment. The analysis took advantage of the ability to measure the IDC capacitance and dissipation factor influenced by insulation permittivity through direct contact with the insulation (using a narrow-tined IDC sensor), the jacket permittivity (using a narrow-tined IDC sensor), and the combined influence of the jacket plus insulation (using a wide-gap-tined IDC sensor). The regression analysis takes advantage of the difference in penetration depth of the electric field due to the narrow and wide gap tined IDCs. The disclosure provides that the penetration depth over the range of interest can be approximately linearly proportional to the tine gap distance. Embodiments described herein are compatible with the use of FEM models. The dual tine gap IDC can be used to assess changing insulation permittivity through a jacket whose permittivity varies as much or more than the insulation permittivity and associated capacitance and dissipation factor.

In view of the many possible embodiments to which the principles of the disclosed may be applied, it should be recognized that the illustrated embodiments included herein and in the attachments are only examples and should not be taken as limiting the scope of the invention.

The methods and systems of the present disclosure will be further described with reference to FIGS. 1A-12, keeping in mind that the entirety of U.S. Provisional Patent Application Ser. No. 62/773,041 filed Nov. 29, 2018, entitled "Methods and Systems for Assessing Cable Insulation", to which this application claims priority, is incorporated by reference herein, and may be relied upon to supplement this disclosure as needed.

Figure 1A:
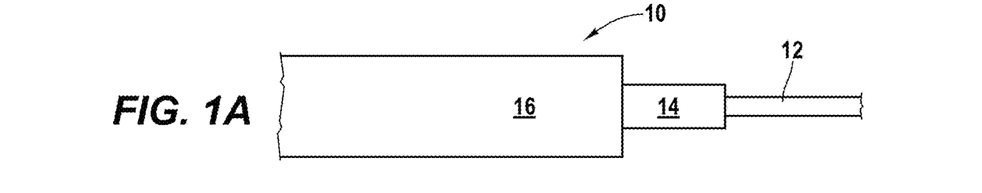
FIGS. 1A-1C are depictions of methods for assessing cable insulation condition in particular stages of the methods.

Referring first to FIGS. 1A-1C, in FIG. 1A, an example jacketed conductive cable 10 is depicted that includes a conductive core member 12, typically constructed of copper or a conductive material. Enclosing copper core member 12 is an insulative material 14, and further enclosing insulative material 14 is a jacket material 16. In typical scenarios, the insulative material can include single materials or multiple materials that insulate the conductive core member from the jacket material 16. Jacket material 16 can include a polymeric material, for example.

Figure 1B:
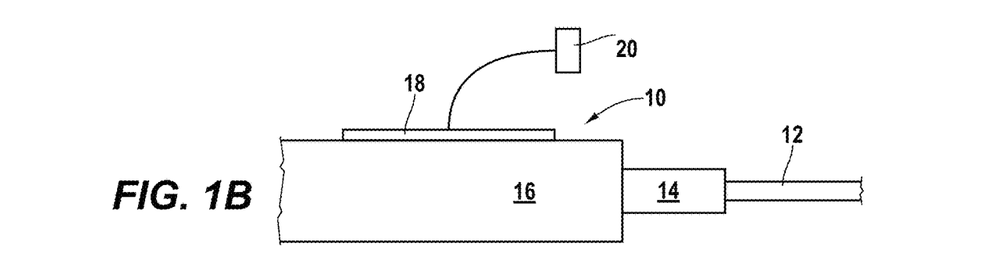
Figure 1C:
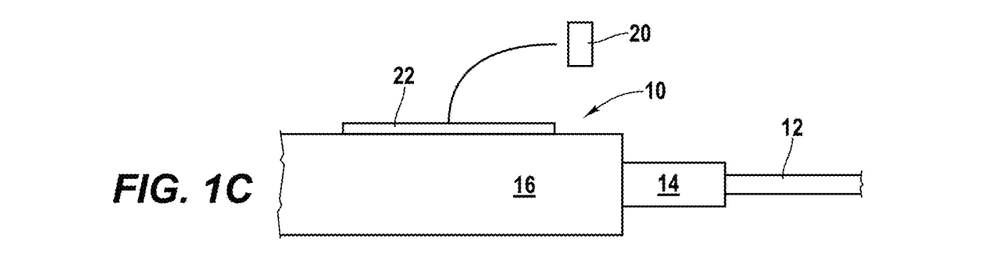

Referring next to FIG. 1B, in accordance with example implementations, tine gap interdigital capacitor assembly 18 is engaged with jacket 16 of cable 10, and this tine gap interdigital capacitor assembly is operatively connected to processing circuitry 20. These tine gap interdigital capacitor assemblies will be shown in greater detail; however, with respect to this figure, it is to be noted that the engagement is sufficient to provide a depth of field to within at least the jacket material 16. The determination of a first permittivity value using process circuitry 20 in operable engagement with assembly 18, a second assembly 22 with reference to FIG. 1C is engaged to jacket 16. Assembly 22 is different than assembly 18, in that at least the gap distances, or g distances (see 62, FIG. 5B) as well as the width distances (69, FIG. 5A), or w distances, are different, and a reading is taken utilizing assembly 22 engaged with jacket 16 using processing circuitry 20. Processing circuitry 20 can be the same or different than the processing circuitry 20 used in FIG. 1B or FIG. 1C. It is not necessary to use the same processing circuitry. Different processing circuitry can be utilized.

Figure 2A:
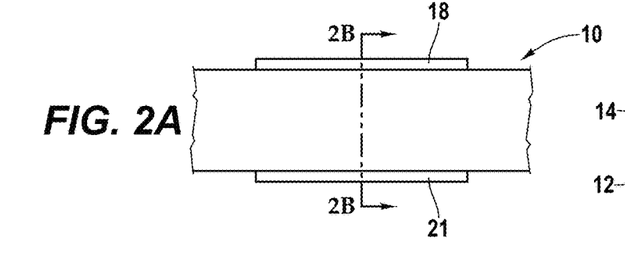
FIGS. 2A-2B depict a system for assessing cable insulation condition according to an embodiment of the disclosure.
Figure 2B:
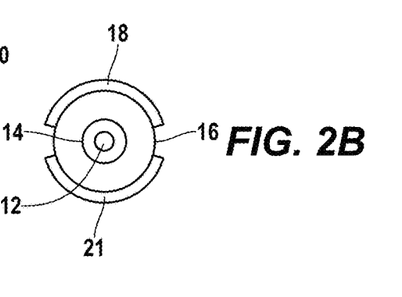

Referring next to FIG. 2A, in accordance with one implementation, a depiction of a system that includes two assemblies 18 and 21, both are operatively engaged with jacket 16 about insulative material 14 and conductive core 12 is shown. In accordance with example implementations, these are shown on opposing sides of cable 10. It is contemplated that these can also be arranged linearly along the length of the cable. They can also be engaged to at least partially overlap. They can occupy the same portion of jacket 16. In other implementations, they can occupy different portions of jacket 16. When the same (or overlapping) cable portion is engaged then the electrodes can be applied successively rather than simultaneously. The insulation and jacket condition can be consistent over the two engagement regions. In accordance with FIGS. 1B and 1C above, it may appear as though they occupy the same portions. They do in some circumstances, but in other circumstances, they may occupy overlapping portions of jacket 16, including opposing portions as shown.

Figure 3:
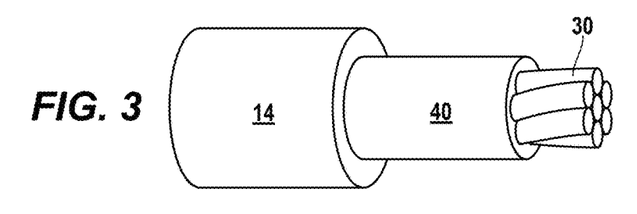
FIG. 3 is an example of cable configuration that can be assessed utilizing the methods and systems of the present disclosure.

Referring to FIG. 3, an example cable is shown that includes conductive core member 30. In accordance with this example implementation, conductive core member 30 may include multiple strands of conductive core members or wires, as shown. The insulation polymer material (like ethylene propylene rubber or EPR), 40 encircles the wire and the jacket polymer material, 14 is normally a different polymer (like Chlorinated Polyethylene or CPE).

Figure 4:
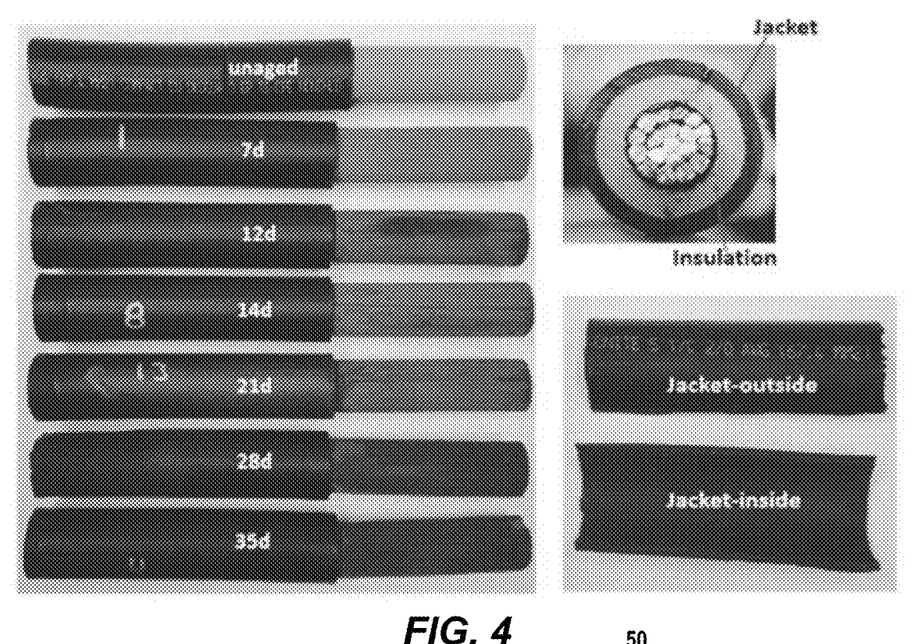
FIG. 4 depicts additional examples of cables that can be assessed utilizing systems and methods of the present disclosure.
Figure 10:
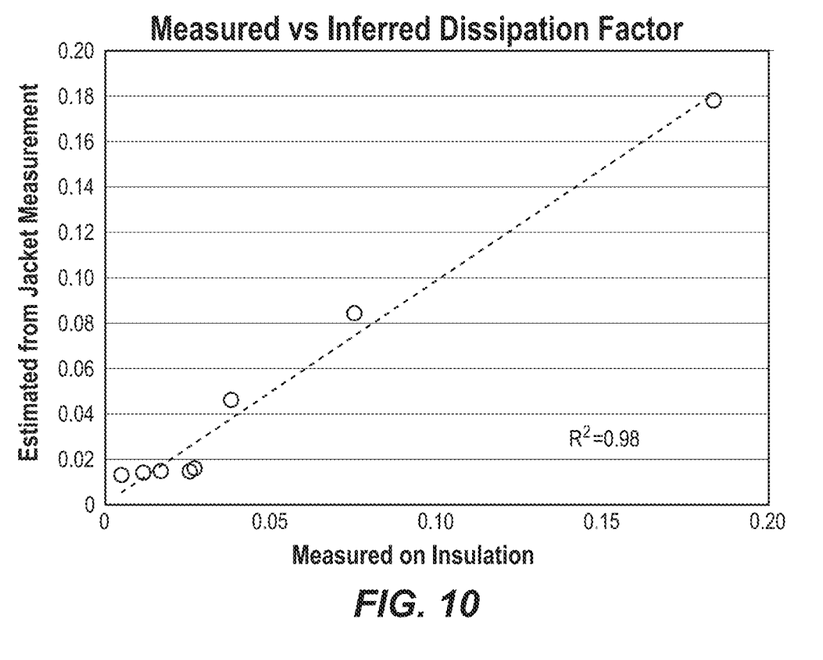
FIG. 10 is an example regression analysis assessing the insulation dissipation factor from measurements on the jacket according to an embodiment of the disclosure.

Referring next to FIG. 4, several segments of an EPR insulation CPE jacket single conductor cable are shown. These segments have been aged from 0 days (i.e. unaged) to 35 days and correspondingly have varying degrees of insulation and jacket damage/permittivity change. These are some of the samples whose measured data are shown in FIG. 10.

Figure 5A:
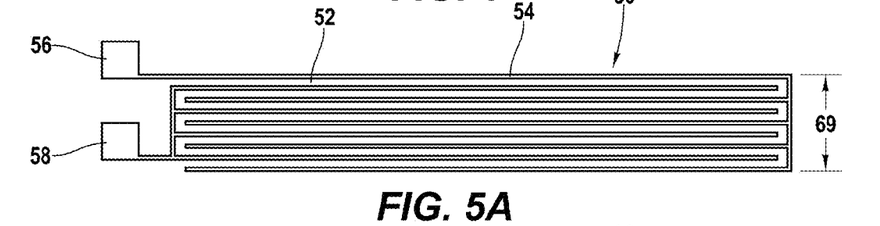
FIGS. 5A-5B are example designs of tine gap interdigital capacitor assemblies that can be utilized according to embodiments of the disclosure.
Figure 5B:
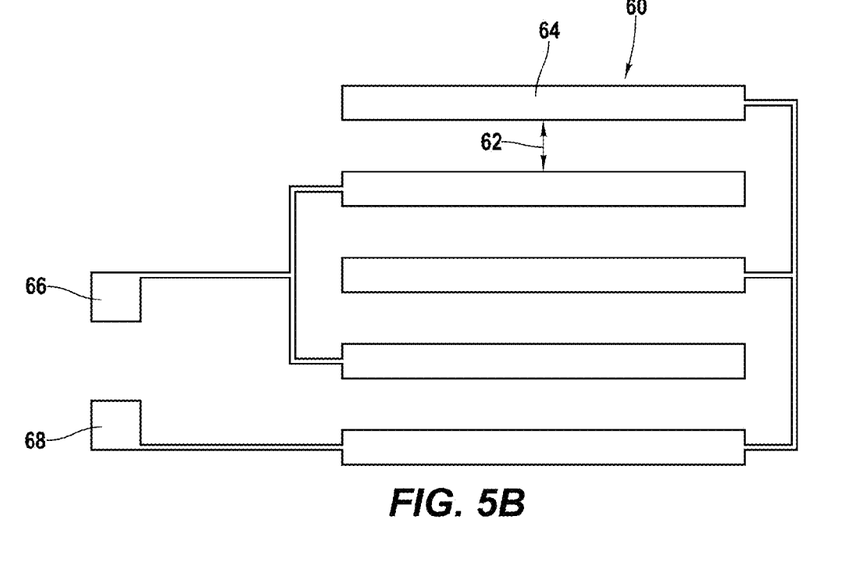

Referring next to FIGS. 5A-5B, two example tine gap interdigital capacitor assemblies are shown in 50 and 60. Referring first to assembly 50, assembly 50 has 9 digits, approximate digit length of 38.1 mm, approximate digit width 54 of 0.1 mm and approximate gap g, or 52, of 0.9 mm, and has an approximate penetration depth of 0.9 mm. With reference to FIG. 5B, a different or what can be considered a second assembly 60 can have a length of 40 mm with a 5 digits, a width 64 of 3.5 mm, and a g 62 of approximately 5 mm, having a penetration depth of approximately 5 mm. In accordance with example implementations, these tine gap interdigital capacitors each can have two electrode connections, 56 and 58, as well as 66 and 68 accordingly.

Figure 6:
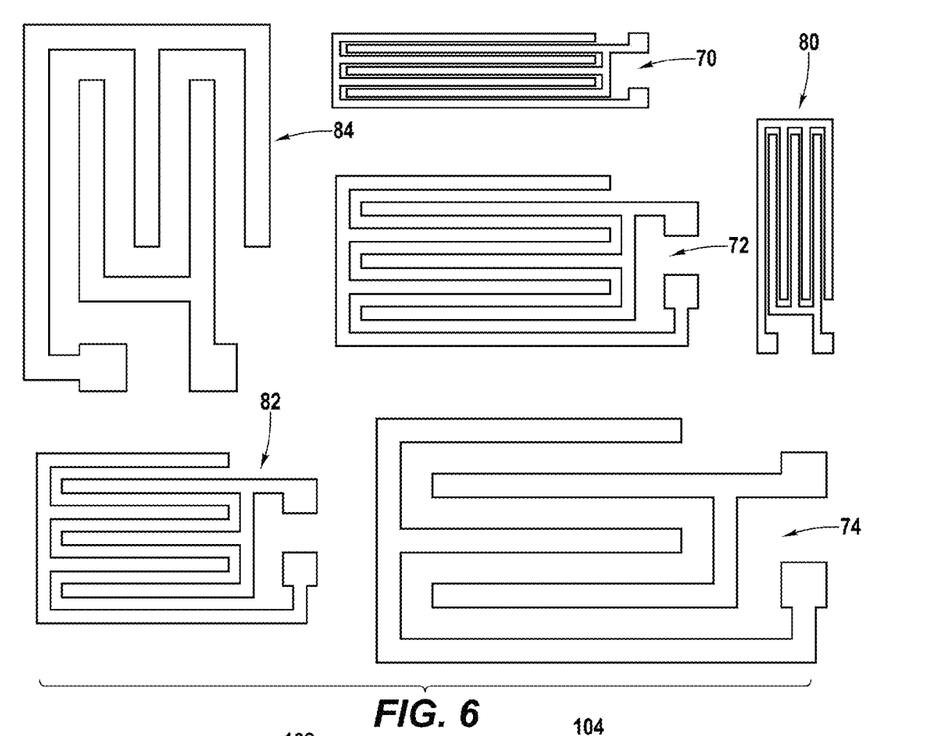
FIG. 6 depicts additional tine gap interdigital capacitor assemblies according to an embodiment of the disclosure.

Referring next to FIG. 6, in combination with Table 1 below, sets of at least six example assemblies 70, 72, and 74 are shown, as well as 80, 82, and 84. In accordance with example implementations, sets 70, 72, and 74 can represent narrow long, medium long, and wide long assemblies, while assemblies 80, 82, and 84 can represent narrow short, medium short, and wide short assemblies, and the detailed construction of these materials and designs is described below in Table 1. Any practical implementation of the method would include a range of electrode sizes to adapt to a broad range of cable sizes.

TABLE 1

Designed parameters of sensors for monitoring
Okoguard ®-Okolon ® TS-CPE Type MV-90
2.4 kV Nonshielded Power Cable

| Sensor | n | w (mm) | g (mm) | C (pF/m) |
|---|---|---|---|---|
| 0 | 9 | 0.1 | 0.1 | 760 |
| 1 | 7 | 1.2 | .5 | 500 |
| 2 | 7 | 2.0 | 2.0 | 460 |
| 3 | 5 | 3.5 | 5.0 | 375 |

Figure 7:
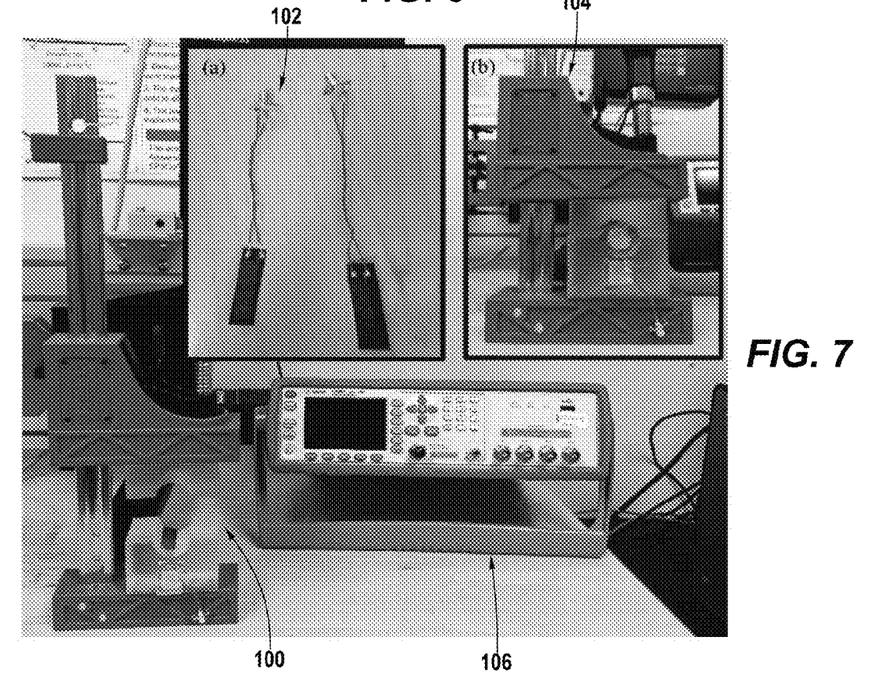
FIG. 7 is a depiction of processing circuitry and assemblies that can be utilized in determining the insulation condition of the cable according to an embodiment of the disclosure.

Referring next to FIG. 7, a preparation assembly 100 in the form of a clamp is shown for attaching assemblies 102 to a cable as desired. In accordance with example implementations, processing circuitry 106 can be coupled to each of these assemblies 102 as desired utilizing clamp assembly 100 as shown in compressed mode 104. In accordance with example implementations, processing circuitry can take the form of an LCR meter such as an Agilent E4980A Precision LCR Meter. The sample holder as shown and the clamp can be acrylic with a subminiature co-axial 50Ω connector.

Figure 8A:
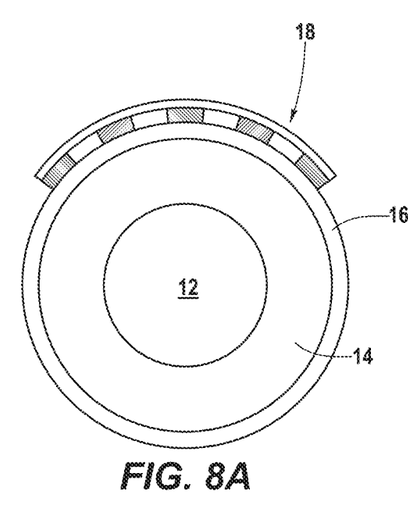
FIGS. 8A-8B are depictions of tine gap interdigital capacitor assemblies engaged with a cable jacket according to an embodiment of the disclosure.
Figure 8B:
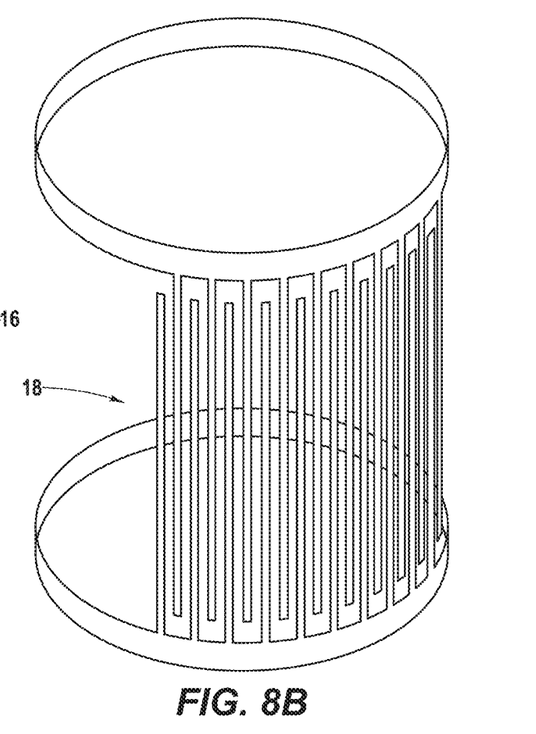

Referring next to FIGS. 8A-8B, a FEM model of an IDC sensor is shown. The sensor's electrical field operatively engages with the cable having jacket 16 above insulative material 14 enclosing conductive core member 12. In accordance with example implementations, sensor tine gaps can be varied and the effect on the electric field depth of penetration is shown in FIG. 9.

Figure 9:
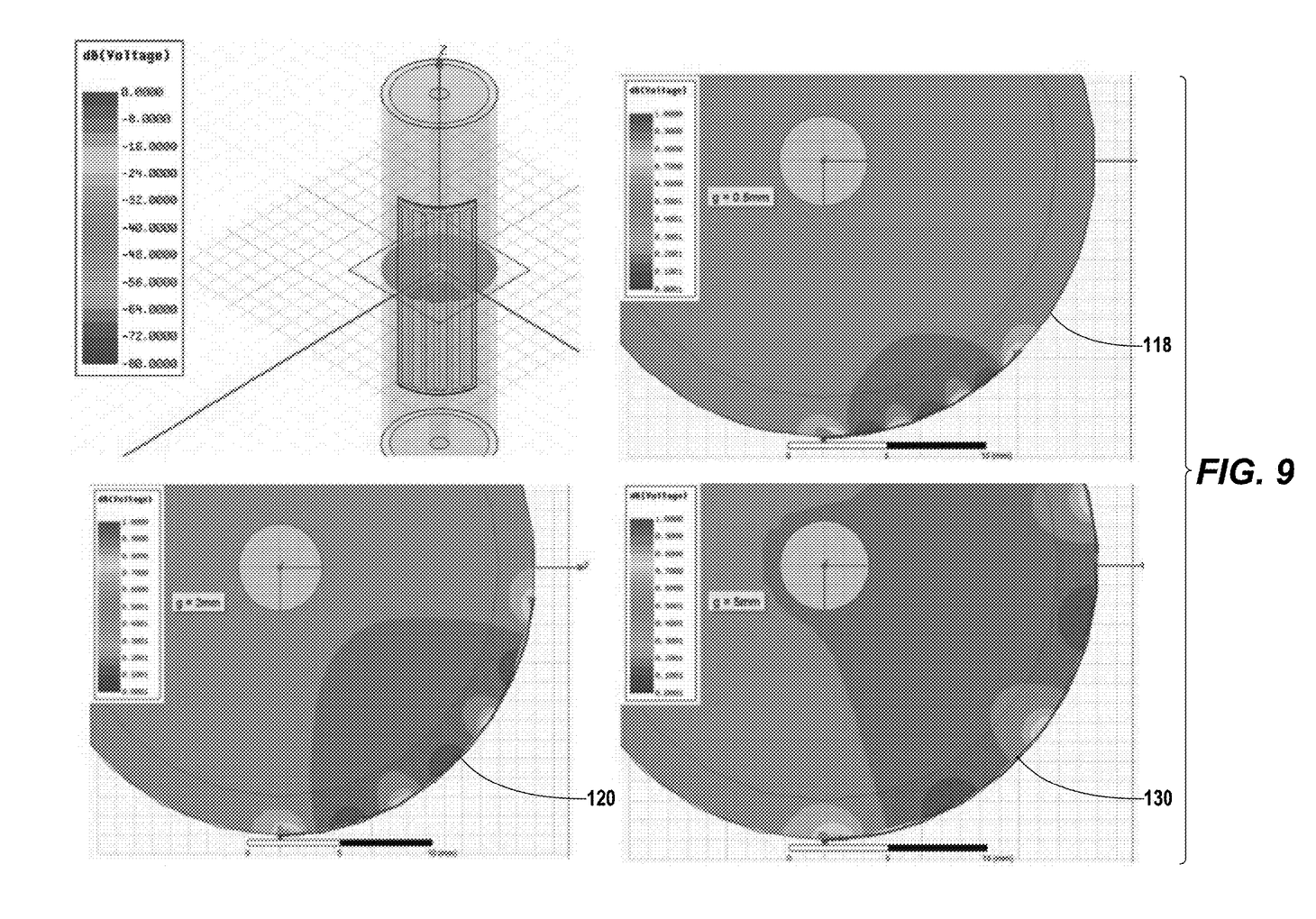
FIG. 9 is a multi-view cross sectional depiction of interdigital capacitor (IDC) field depths according to tine gap width according to an embodiment of the disclosure.

Referring to FIG. 9, a 7-tine assembly which was modeled having 3 different tine gaps is shown depicting the cross-sectional electric field depth of penetration. In the first configuration 118, the tine spacing has a g of 0.5. In the second configuration 120, the tine spacing is 2 mm, and in a third configuration 130, the tine spacing is 5 mm.

Figure 11:
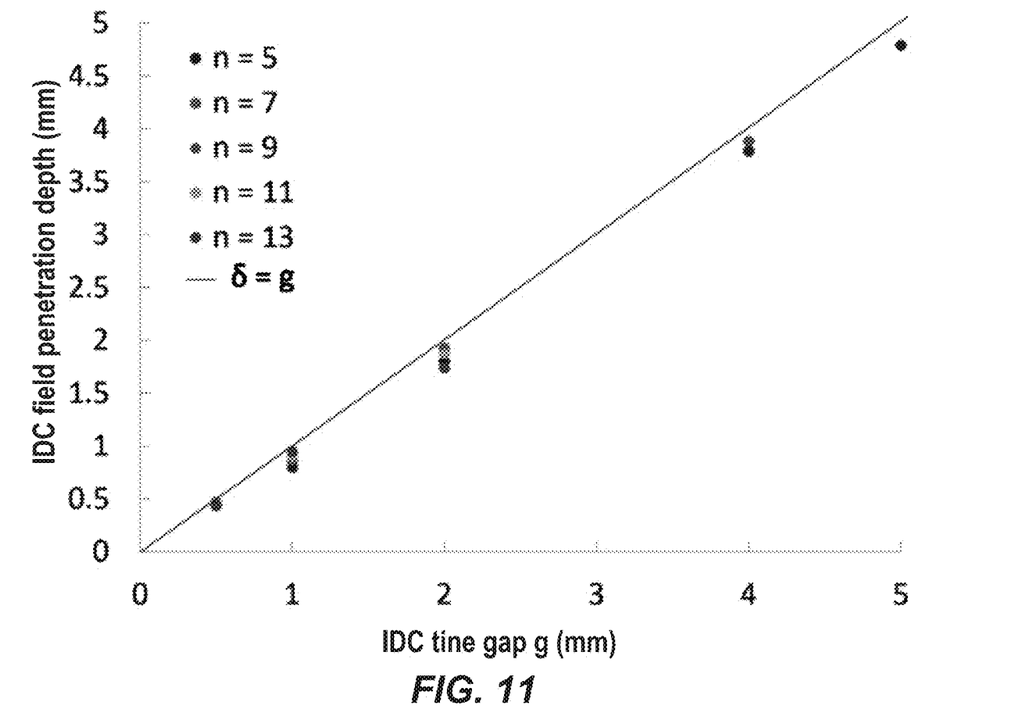
FIG. 11 depicts the linear relation between IDC tine gap width and depth of the electrical field

The model was iteratively used with tine gaps of 0.5, 1.0, 2.0, 4.0, and 5.0 to map the effective skin depth as shown in FIG. 11. These results show that the depth of field is approximately equal to the tine gap.

In accordance with example implementations, the 2-factor regression follows the form:

$$Y_{Narrow\ or\ Wide} = a*\text{Wide} + b*\text{Narrow} + c \qquad \text{[equation 1]}$$

Where $Y_{Narrow\ or\ Wide}$=the estimated capacitance if a narrow or wide tine gap IDC were placed directly on the insulation based on Narrow and Wide tine gap sensor measurements on the jacket.

Wide=the measured capacitance for a wide tine gap IDC placed on the jacket (with a corresponding deep field penetration into and affected by material characteristics of both the jacket and underlying insulation)

Narrow=the measured capacitance for a narrow tine gap IDC placed on the jacket (with a corresponding shallow penetration into and affected by primarily the material characteristics only of the jacket).

The a, b, and c values are the 2-factor linear regression coefficients determined by fitting equation 1 to measured or predicted data. After a, b, and c are determined, equation 1 can be referred to as "calibrated". Data for this calibration may be generated by either:

(1) Measurements (preferably 3 or more) of Wide, Narrow, and an actual measurements of $Y_{Narrow\ or\ Wide}$ by stripping the jacket off calibration samples as seen in FIG. 4. The measured dissipation factor on the insulation vs. estimated insulation dissipation factor from measurements on the jacket are shown in FIG. 10.

Figure 12:
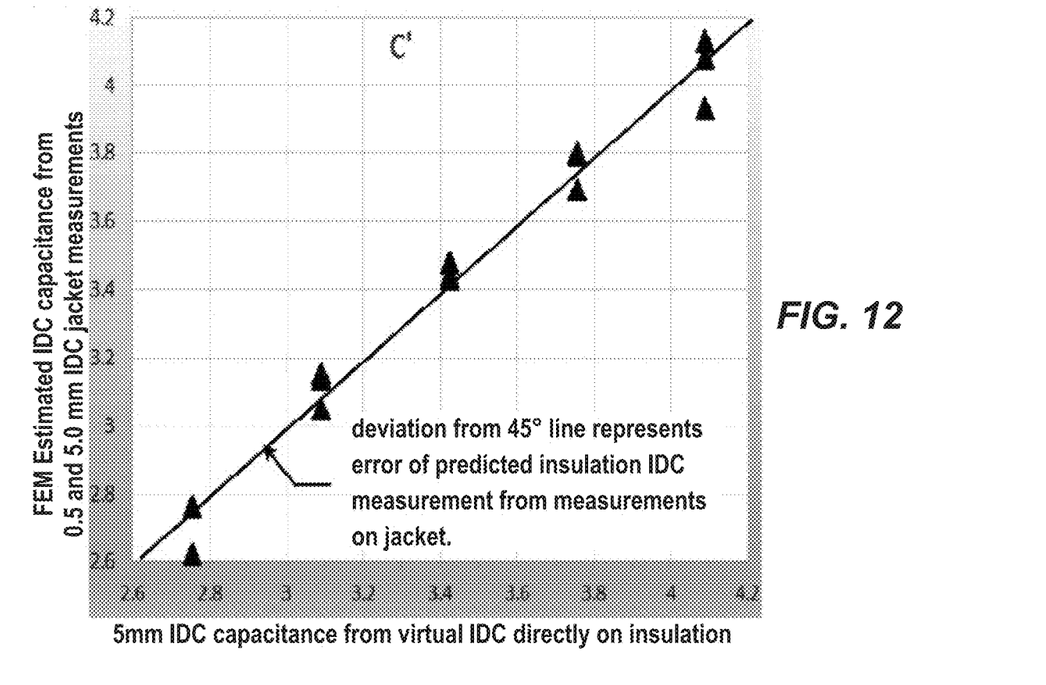
FIG. 12 depicts application of the method based on FEM for jacket and insulation permittivity varying by +/−20%

(2) Finite element model (FEM) predictions of Wide and Narrow IDC capacitance measurements based on an accurate representation of the IDC sensor—particularly the tine gap plus assumed nominal permittivity values for the insulation and jacket. The multiple data points for the regression are obtained by iteratively solving the FEM with insulation and jacket permittivities varied by +/−10 to 30%. An example of this is shown in FIG. 12.

The calibrated equation 1 can then be used to predict a measurement directly on the insulation ($Y_{narrow\ or\ wide}$) based on measurands of Wide and Narrow taken on the outside jacket.

The same procedure can be applied to a measured or modeled dissipation factor, D, instead of the capacitance and, in fact, experience shows the dissipation factor, D, to be a better indicator than capacitance. D is defined by:

$$D=\varepsilon''/\varepsilon' \text{ and } \varepsilon^*=\varepsilon'-j\varepsilon'' \text{ where } \varepsilon' \text{ is the real and } \varepsilon'' \text{ is the imaginary part of the complex permittivity of the material.}$$

Both C and D are measured by modern laboratory capacitance instruments. These values vary as a function of frequency in polymer materials so measurements must be referenced to the same excitation frequency.

Accordingly, the permittivity values can be solved for a specific IDC design and the measured capacitance using the FEM.

The $R^2$ correlation coefficient as shown in FIG. 10 ($R^2$=9.8) indicates the quality of the line fit to the measured vs. estimated data. $R^2$ values closer to 1 indicate a high correlation between the inferred values from the jacket measurements and reference measured or modeled values directly from the insulation.

In compliance with the statute, embodiments of the invention have been described in language more or less specific as to structural and methodical features. It is to be understood, however, that the entire invention is not limited to the specific features and/or embodiments shown and/or described, since the disclosed embodiments comprise forms of putting the invention into effect. The invention is, therefore, claimed in any of its forms or modifications within the proper scope of the appended claims appropriately interpreted in accordance with the doctrine of equivalents.

The invention claimed is:

1. A method for assessing cable insulation, the method comprising:
engaging a first tine gap interdigital capacitor assembly with a first portion of the exterior of the cable jacket, the first tine gap interdigital capacitor assembly comprising a first electrode, and the engaging comprising aligning the first electrode on the exterior of the cable jacket;
determining a first capacitance or dissipation value of the insulation using the first tine gap interdigital capacitor assembly;
engaging a second tine gap interdigital capacitor assembly with a second portion of the exterior of the cable jacket, the second tine gap interdigital capacitor assembly comprising a second electrode, and the engaging comprising aligning the second electrode on the exterior of the cable jacket;
determining a second capacitance or dissipation value of the insulation using the second tine gap interdigital capacitor assembly, wherein the first and second tine gap interdigital capacitor assemblies have different gap widths; and
estimating capacitance or dissipation factor of the insulation using a calibrated regression model, wherein said estimating includes calibrating the regression model by determining 2-factor linear regression coefficients of the regression model based on the first and second values.

2. The method of claim 1 wherein the determining of the capacitance and dissipation factor occurs through the cable jacket that at least partially surrounds the cable insulation.

3. The method of claim 1 wherein the first and second portions of the cable are the same portions.

4. The method of claim 1 wherein the first and second portions of the cable are different portions.

5. The method of claim 1 wherein the first and second portions overlap.

6. The method of claim 1 wherein the first and second portions do not overlap.

7. The method of claim 1 wherein the first and second portions are opposing portions of the cable jacket.

8. The method of claim 1 wherein both the first and second tine gap interdigital capacitor assemblies are simultaneously engaged with the cable jacket.

9. The method of claim 8 wherein determining the first capacitance and dissipation value of the insulation using the first tine gap interdigital capacitor assembly occurs while both the first and second tine gap assemblies are engaged with the cable jacket.

10. The method of claim 8 wherein determining the second capacitance and dissipation value of the insulation using the second tine gap interdigital capacitor assembly occurs while both the first and second tine gap assemblies are engaged with the cable jacket.

11. A method for nondestructively assessing cable insulation age-related damage without contacting the insulation but measuring through the outer jacket; the method comprising:
engaging a first (narrow) tine gap interdigital capacitor assembly engaged with a first portion of the exterior of the cable jacket, the first tine gap interdigital capacitor assembly comprising a first electrode, and the engaging comprising aligning the first electrode on the exterior of the cable jacket;
determining a first capacitance or dissipation value of the jacket and insulation using the first tine gap interdigital capacitor assembly;
engaging a second (wide) tine gap interdigital capacitor assembly with a second portion of the exterior of the cable jacket, the second tine gap interdigital capacitor assembly comprising a second electrode, and the engaging comprising aligning the second electrode on the exterior of the cable jacket;
determining a second capacitance or dissipation value of the jacket and insulation using the second tine gap interdigital capacitor assembly, wherein the first and second tine gap interdigital capacitor assemblies have different gap widths and corresponding depths of field; and
estimating capacitance or dissipation factor of the cable insulation using a calibrated regression model, wherein said estimating includes calibrating the regression model by determining 2-factor linear regression coefficients of the regression model based on the first and second values.

12. The method of claim 11 wherein the determining of the capacitance and dissipation factor occurs through the cable jacket that at least partially surrounds the cable insulation.

13. A system for assessing cable insulation age-related damage, the system comprising:

a cable jacket encompassing cable insulation and conductive material;

at least two tine gap interdigital capacitor assemblies engaged with and residing upon the exterior of the cable jacket; and a first tine gap interdigital capacitor assembly configured to engage with a first portion of the exterior of the cable jacket, the first tine gap interdigital capacitor assembly comprising a first electrode, and the engaging comprising aligning the first electrode on the exterior of the cable jacket;

a second tine gap interdigital capacitor assembly having a different gap width than the first tine gap interdigital capacitor assembly and configured to engage with a second portion of the exterior of the cable jacket, the second tine gap interdigital capacitor assembly comprising a second electrode, and the engaging comprising aligning the second electrode on the exterior of the cable jacket;

processing circuitry operatively engaged with the capacitor assembles and configured to:

determine a first capacitance or dissipation value of the cable insulation using the first tine gap interdigital capacitor assembly;

determine a second capacitance or dissipation value of the cable insulation using the second tine gap interdigital capacitor assembly; and estimate capacitance or dissipation factor of the cable insulation using a calibrated regression model, wherein said estimating includes calibrating the regression model by determining 2-factor linear regression coefficients of the regression model based on the first and second values.

14. The system of claim 13 wherein the assemblies are positioned opposing one another when engaged with the cable jacket.

* * * * *